(12) United States Patent
Yang et al.

(10) Patent No.: US 11,164,634 B2
(45) Date of Patent: Nov. 2, 2021

(54) NON-VOLATILE STORAGE SYSTEM WITH FAST SLC OPERATION

(71) Applicant: WESTERN DIGITAL TECHNOLOGIES, INC., San Jose, CA (US)

(72) Inventors: Niles Yang, Mountain View, CA (US); Sahil Sharma, San Jose, CA (US); Rohit Sehgal, San Jose, CA (US); Phil Reusswig, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 98 days.

(21) Appl. No.: 16/450,817

(22) Filed: Jun. 24, 2019

(65) Prior Publication Data
US 2020/0402582 A1 Dec. 24, 2020

(51) Int. Cl.
| | |
|---|---|
| *G11C 16/10* | (2006.01) |
| *G11C 16/14* | (2006.01) |
| *G11C 16/34* | (2006.01) |
| *G11C 16/26* | (2006.01) |
| *G11C 11/56* | (2006.01) |
| *G06F 3/06* | (2006.01) |
| *G11C 16/04* | (2006.01) |

(52) U.S. Cl.
CPC ............ *G11C 16/10* (2013.01); *G06F 3/0604* (2013.01); *G06F 3/0659* (2013.01); *G06F 3/0679* (2013.01); *G11C 11/5628* (2013.01); *G11C 11/5635* (2013.01); *G11C 11/5642* (2013.01); *G11C 11/5671* (2013.01); *G11C 16/0483* (2013.01); *G11C 16/14* (2013.01); *G11C 16/26* (2013.01); *G11C 16/3459* (2013.01)

(58) Field of Classification Search
CPC ..... G11C 16/10; G11C 16/0483; G11C 16/14; G11C 16/26; G11C 16/3459; G11C 11/5628; G11C 11/5635; G11C 11/5642; G11C 11/5671; G06F 3/0659; G06F 3/0679; G06F 3/0604
USPC .................................................. 365/185.03
See application file for complete search history.

(56) References Cited

U.S. PATENT DOCUMENTS

| | | | |
|---|---|---|---|
| 8,713,380 B2 | 4/2014 | Avila et al. | |
| 9,152,555 B2 | 10/2015 | Higgins et al. | |
| 9,214,240 B2 | 12/2015 | Dutta et al. | |
| 9,588,702 B2 | 3/2017 | Mittelholzer et al. | |

(Continued)

*Primary Examiner* — Sung Il Cho
(74) *Attorney, Agent, or Firm* — Vierra Magen Marcus LLP

(57) ABSTRACT

A storage system comprises a controller connected to blocks of non-volatile memory cells. The memory cells can be operated as single level cell ("SLC") memory cells or multi-level cell ("MLC") memory cells. To increase write performance for a subset of memory cells being operated as SLC memory cells, the controller performs a deeper erase process and a weaker program process for the subset of memory cells. The weaker program process results in a programmed threshold voltage distribution that is lower than the "nominal" programmed threshold voltage distribution. Having a lower programmed threshold voltage distribution reduces the magnitude of the programming and sensing voltages needed and, therefore, shortens the time required to generate the programming and sensing voltages, and reduces power consumption.

16 Claims, 15 Drawing Sheets

(56) References Cited

U.S. PATENT DOCUMENTS

| | | |
|---|---|---|
| 2012/0243328 A1 | 9/2012 | Tatebe et al. |
| 2016/0103630 A1* | 4/2016 | Shen .................. G06F 3/0616 714/37 |
| 2016/0180958 A1* | 6/2016 | Raghunathan ...... G06F 12/0246 365/185.24 |
| 2016/0180959 A1 | 6/2016 | Darragh et al. |
| 2017/0256309 A1* | 9/2017 | Yoon .................. G11C 11/5642 |
| 2018/0047444 A1* | 2/2018 | Pignatelli ............. G11C 29/021 |
| 2018/0211708 A1* | 7/2018 | Igahara ................ G06F 3/0679 |
| 2019/0043589 A1* | 2/2019 | Kwok ................ G11C 11/5642 |
| 2019/0333587 A1* | 10/2019 | Kim .................. G11C 16/0483 |
| 2020/0058359 A1* | 2/2020 | Lee ........................ G11C 16/08 |
| 2020/0183780 A1* | 6/2020 | Barbato ............. G11C 16/3495 |
| 2020/0202938 A1* | 6/2020 | Reina .................... G06F 11/076 |

\* cited by examiner

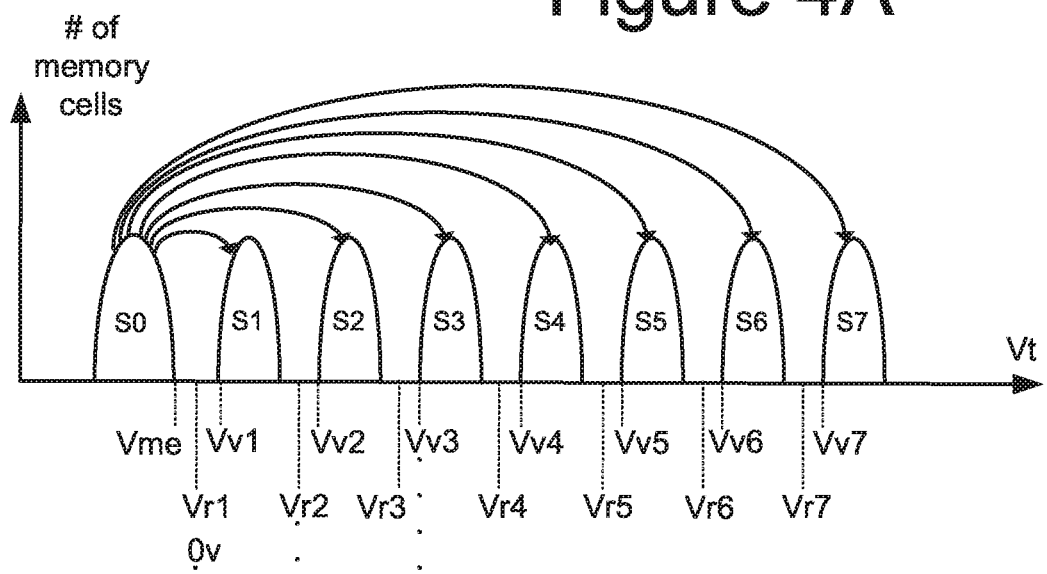
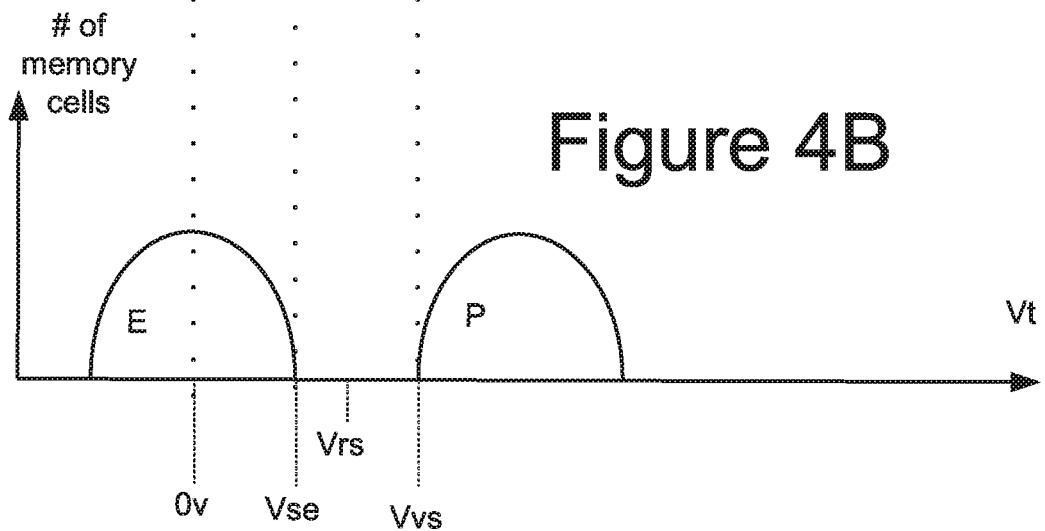

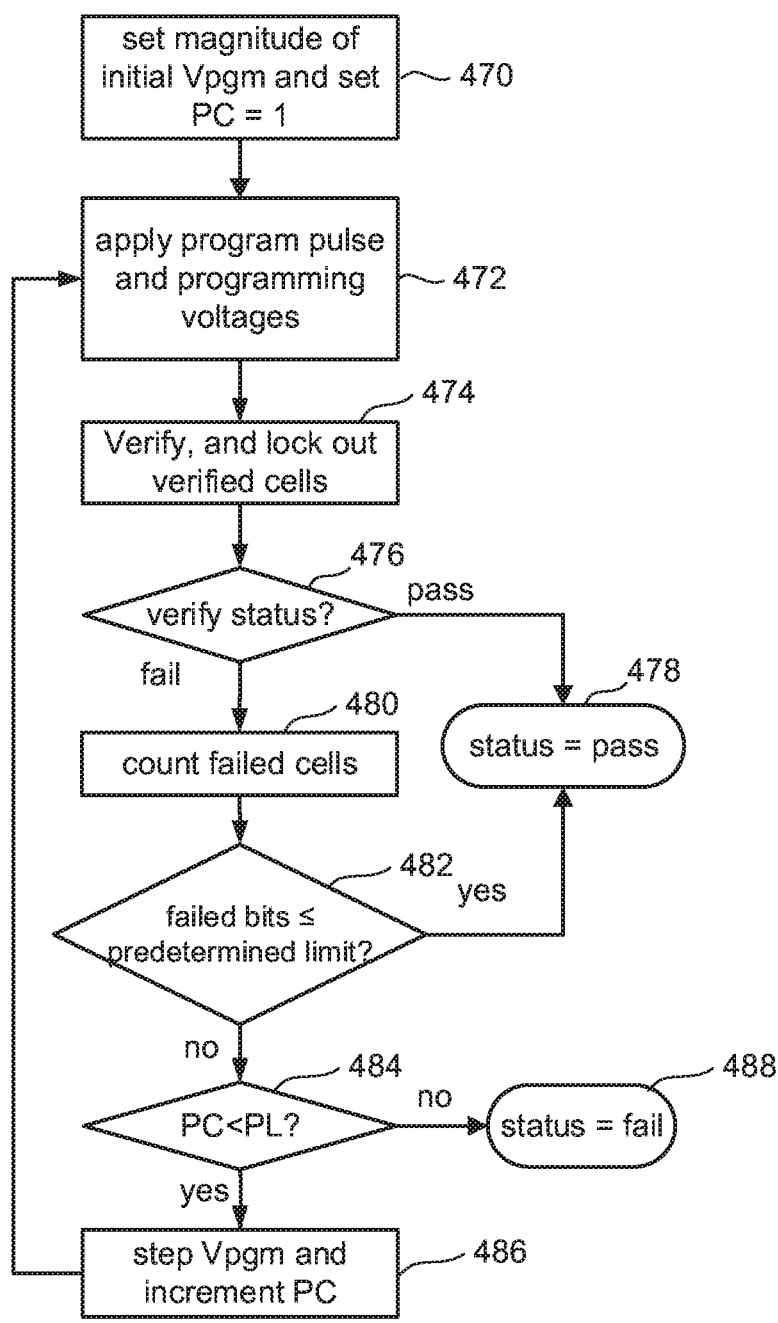

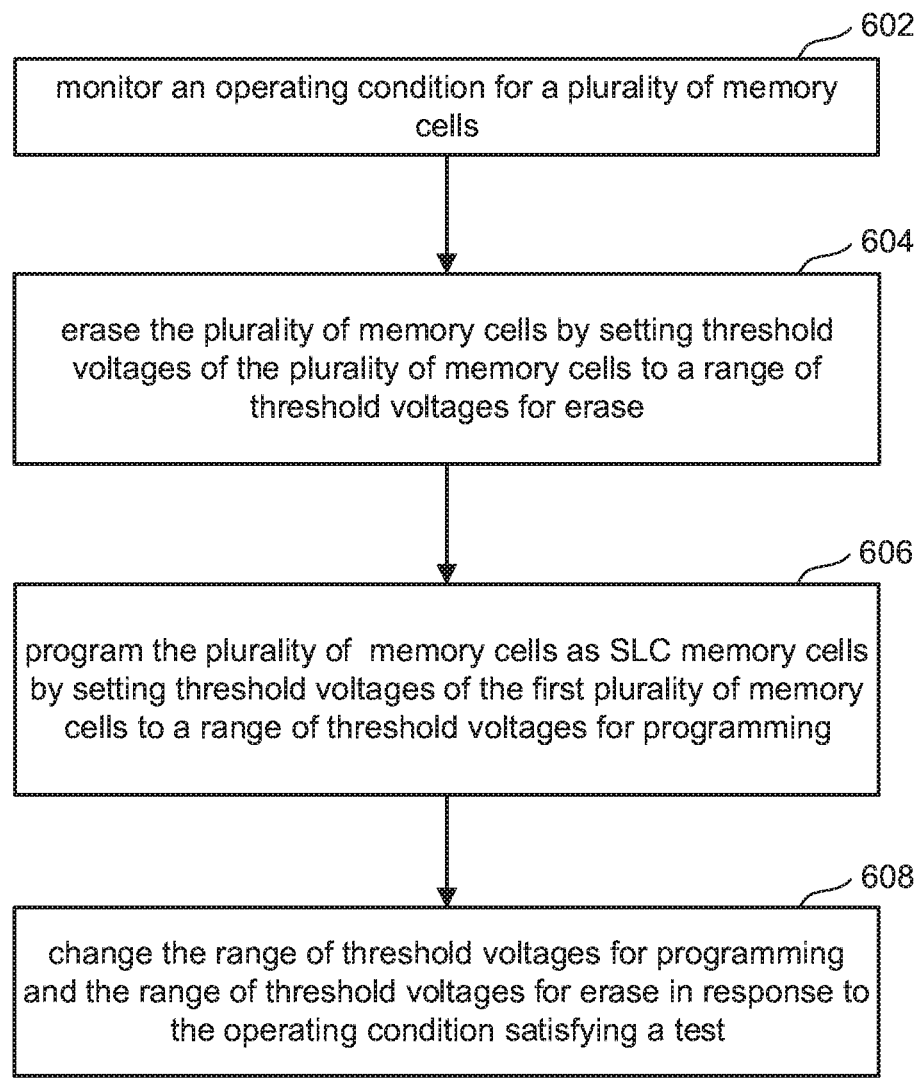

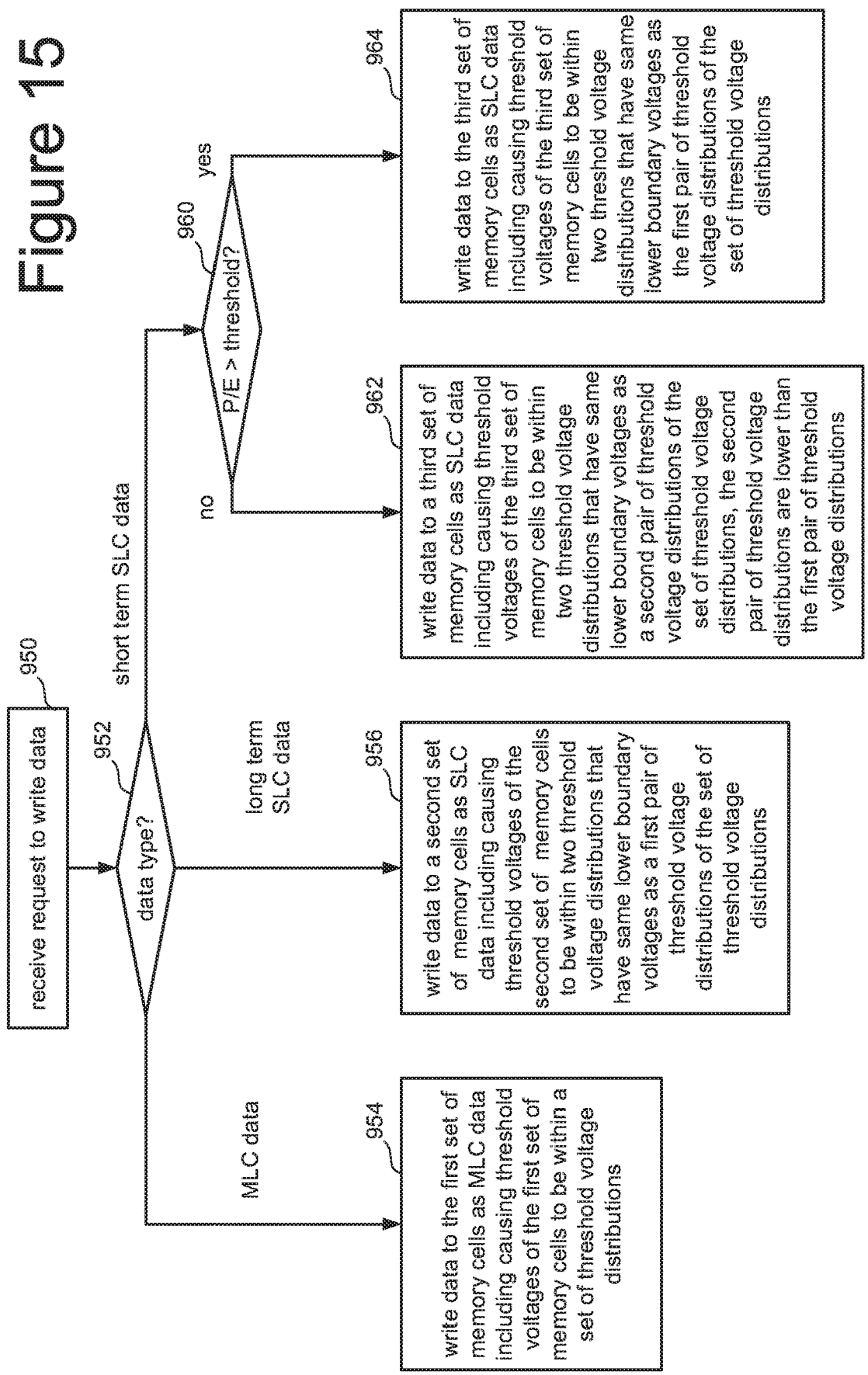

NON-VOLATILE STORAGE SYSTEM WITH FAST SLC OPERATION

BACKGROUND

Many electronic devices make use of an embedded or otherwise connected memory. Often, the embedded or connected memory includes non-volatile memory. A host refers to a device that makes use of memory or storage. A host can be connected to memory or storage. Alternatively, memory or storage can be embedded within a host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a storage device that uses semiconductor based non-volatile memory is a solid state drive ("SSD").

Non-volatile storage devices, such as SSDs, have become more popular and are now being used with more applications. Users of SSDs and other storage or memory devices desire high performance (e.g., fast write and read operation times).

BRIEF DESCRIPTION OF THE DRAWINGS

Like-numbered elements refer to common components in the different figures.

FIG. 4A is a graph of number of memory cells versus threshold voltage.

FIG. 4B is a graph of number of memory cells versus threshold voltage.

FIG. 5 is a flow chart describing one embodiment of a process for programming.

FIG. 7 is a flow chart describing one embodiment of a process for operating non-volatile memory.

FIG. 15 is a flow chart describing one embodiment of a process for operating non-volatile memory.

DETAILED DESCRIPTION

Figure 1A:
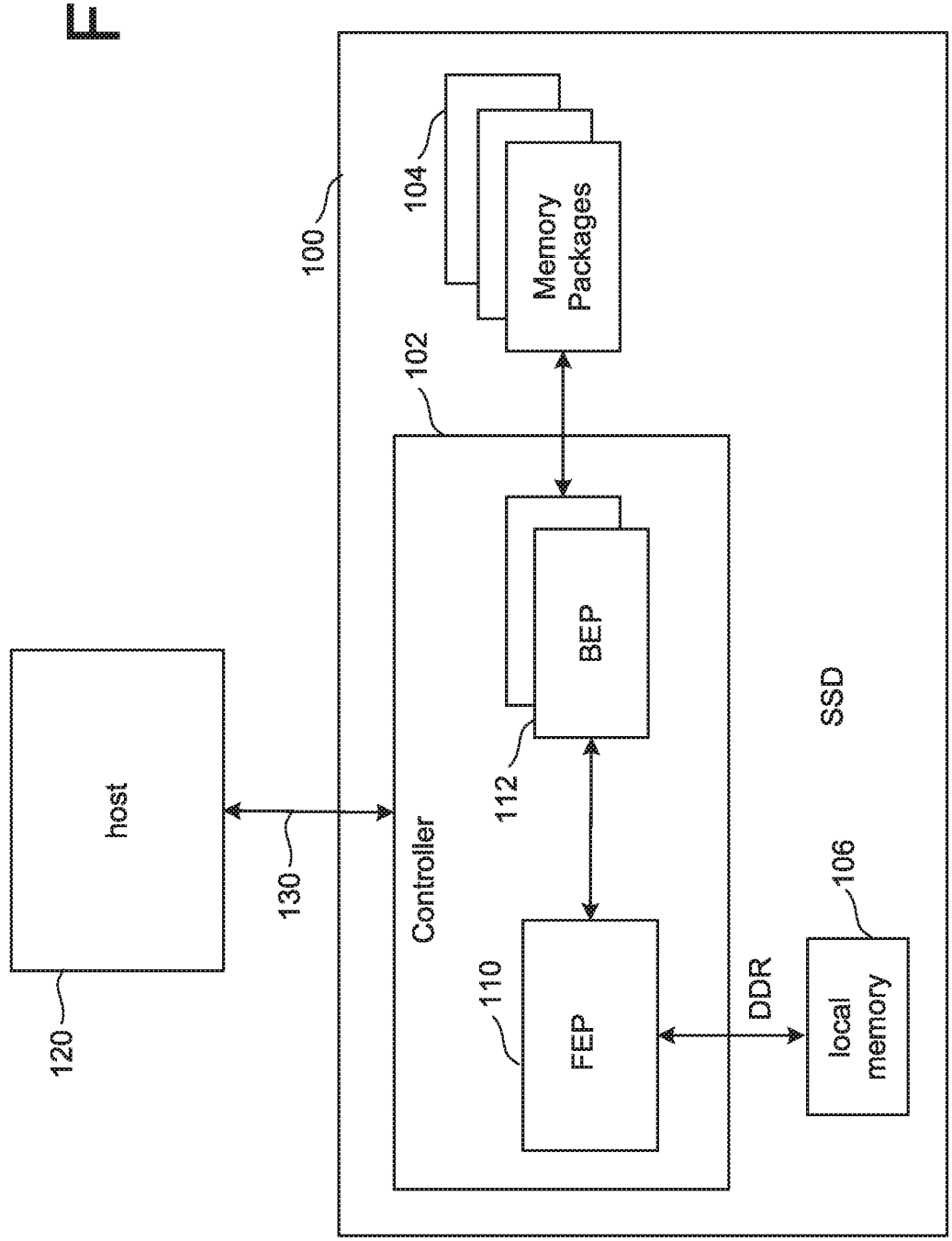
FIG. 1A is a block diagram of one embodiment of a storage device connected to a host.

The basic unit of storage in non-volatile memory systems is a memory cell. In some embodiments, memory cells store one bit of data and are referred to as Single Level Cells ("SLC"). A SLC memory cell can either be in an erased data state or a programmed data state. In other embodiments, memory cells store multiple bits of data and are referred to as Multi Level Cells ("MLC"). MLC memory cells can store two bits of data per memory cell, three bits of data per memory cell, four bits of data per memory cell, etc. A MLC memory cell can be in an erased data state or any one of multiple programmed data states. For example, a MLC memory cell that stores three bits of data (referred to as a three level cell—TLC), can be in an erased data state or any one of seven programmed data states. Because SLC memory cells only have two valid data states (erased and programmed), there is more margin between data states and less precision is required; therefore, SLC memory cells can be operated faster. MLC memory cells are typically operated slower so that they can be more precisely programmed into any one of multiple programmed data states.

Performance has been a major focus for the development of storage systems, such as solid state drives ("SSD"). Typically, high performance SSDs predominantly use SLC memory cells to achieve higher performance (e.g., faster). To further increase performance, it is proposed that for a subset of memory cells being operated as SLC memory cells the memory system perform a deeper erase process and a weaker (shallower) program process. The deeper erase process enables the system to successfully read memory cells that experienced a weaker program process. The weaker (shallower) program process results in a programmed threshold voltage distribution that is lower than the nominal programmed threshold voltage distribution. Having a lower programmed threshold voltage distribution reduces the magnitude of the programming and sensing voltages needed and, therefore, shortens the time required to generate the programming and sensing voltages, and reduces power consumption.

As the memory cells age (e.g., experience large amounts of program/erase cycles), performance can degrade, which may result in more errors during programming and reading. Therefore, the above-described proposal to perform a deeper erase process and a weaker program process may not be as effective for memory cells that have undergone many program/erase cycles. To address this issue, the memory system will monitor the number of program/erase cycles (and/or other operating conditions of the memory cells) and adjust the depth of erase and programming accordingly.

One embodiment includes a non-volatile storage apparatus comprising a first plurality of non-volatile memory cells and a control circuit connected to the first plurality of non-volatile memory cells. The control circuit is configured to monitor an operating condition (e.g., number of program/erase cycles) for the first plurality of non-volatile memory cells. The control circuit is configured to program the first plurality of non-volatile memory cells as SLC memory cells by setting threshold voltages of the first plurality of non-volatile memory cells to a range of threshold voltages for programming. The control circuit is configured to erase the first plurality of non-volatile memory cells by setting threshold voltages of the first plurality of non-volatile memory cells to a range of threshold voltages for erase. The control circuit is configured to change the range of threshold voltages for programming and the range of threshold voltages for erase in response to the operating condition satisfying a test.

FIG. 1A is a block diagram of one embodiment of a storage device 100 connected to a host 120 that can implement the technology proposed herein. Many different types of storage or memory devices can be used with the technology proposed herein. One example of a storage device is a solid state drive ("SSD"); however, other types of storage and memory devices can also be used. Storage device 100 comprises a controller 102, non-volatile memory 104 for storing data, and local memory 106 (e.g. DRAM. SRAM or ReRAM). In one embodiment, controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a flash translation layer that performs memory management (e.g., garbage collection, wear leveling, etc.), logical to physical address translation, communication with the host, management of DRAM (local memory) and management of the overall operation of the SSD (or other non-volatile storage system). BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (e.g., generate error correction code (ECC)), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Host 120 is one example of an entity that is external to storage device 100. For example, host 120 can be a computer, video camera, still camera, audio recorder, smart appliance, etc. that has storage device 100 embedded therein, or otherwise connected to storage system 100. Other examples of an entity that is external to storage device 100 include other computing devices (e.g., computers, servers, smart appliances, smart phones, etc.) that are connected to storage device 100 and other computing systems that are in communication with storage device 100 via any communication means (e.g., LAN, WAN, WiFi, wired connection, wireless connection, direct connection, indirect connection, etc.). Controller 102 communicates with host 120 via an interface 130 that implements NVM Express (NVMe) over PCI Express (PCIe). In one embodiment, the storage device implements the CFexpress standard.

Figure 1B:
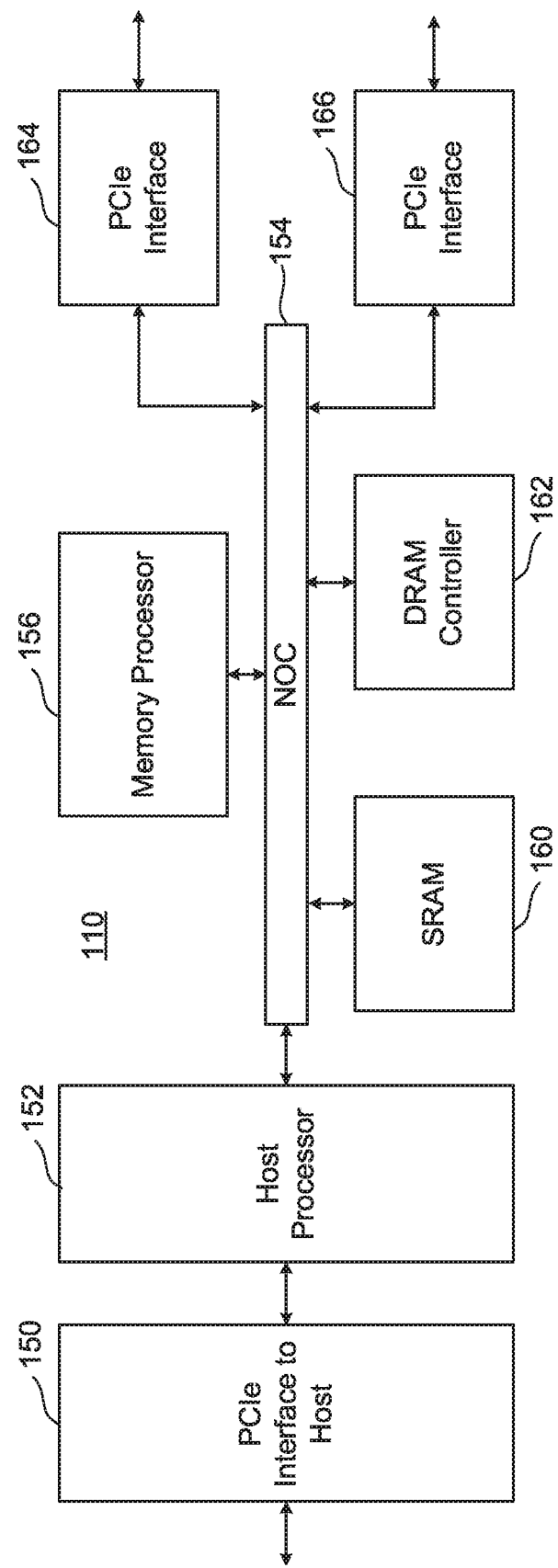
FIG. 1B is a block diagram of one embodiment of a Front End Processor Circuit. In some embodiments, the Front End Processor Circuit is part of a controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
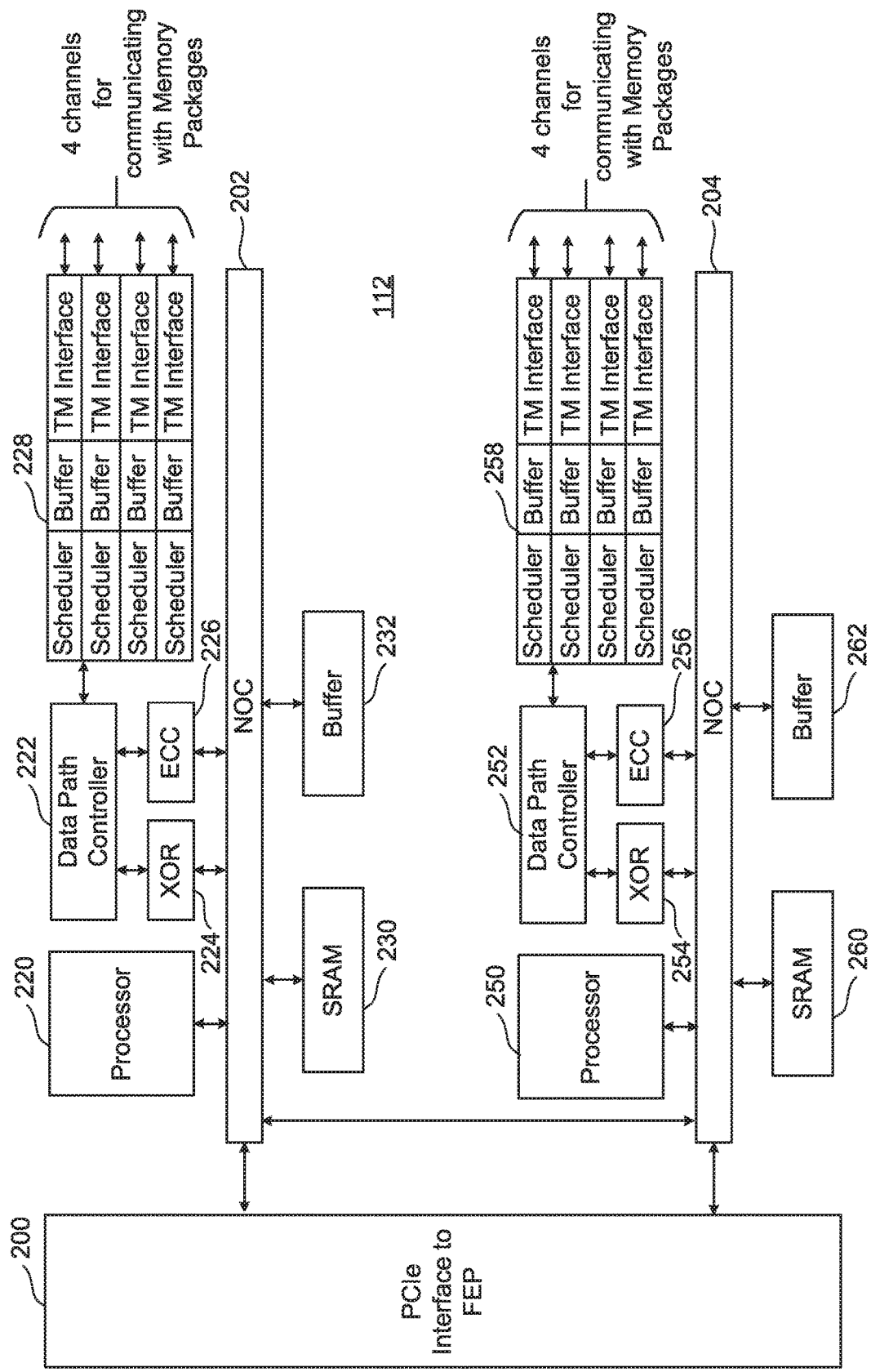
FIG. 1C is a block diagram of one embodiment of a Back End Processor Circuit. In some embodiments, the Back End Processor Circuit is part of a controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR the write data with previous data written to a block with data written to other memory dies so that the write data can be combined and stored in a manner that can be recovered in case there is a programming error. In one example, the XOR data is stored in DRAM 106 or in one of the memory die in the storage device. After the programming operation is complete, in order to verify that the programming operation was successful, the storage device may read the data page(s) that were programmed and/or data surrounding the newly programmed pages. If any of these read operations fail, the system may perform one or more XOR operations (or other logical/mathematical operations) on the stored combined data with the regions not currently programmed, thus recovering a safe copy of the original data to be programmed. The system may then locate a free region of memory on which to program the saved (recovered) copy.

Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
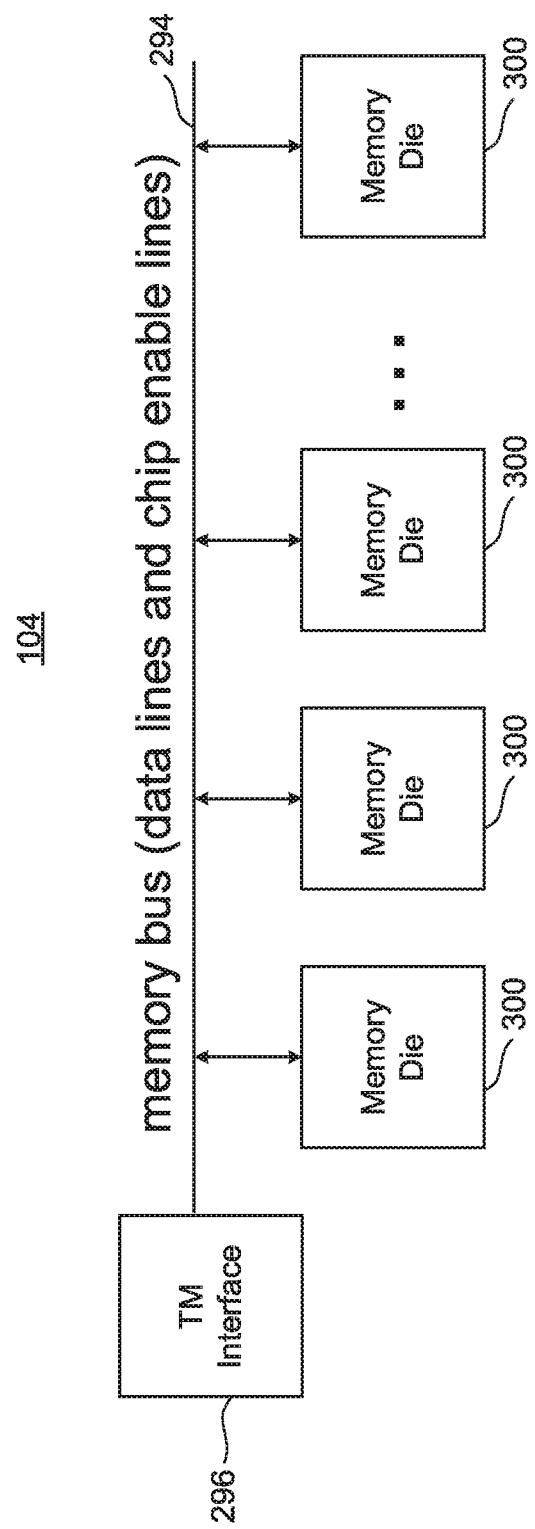
FIG. 1D is a block diagram of one embodiment of a memory package.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture of a controller. However, the technology described herein is not limited to any specific form of the controller. Therefore, other architectures can be utilized for the controller. For example, other embodiments of a controller include microprocessors, microcontrollers, state machine, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

Figure 2:
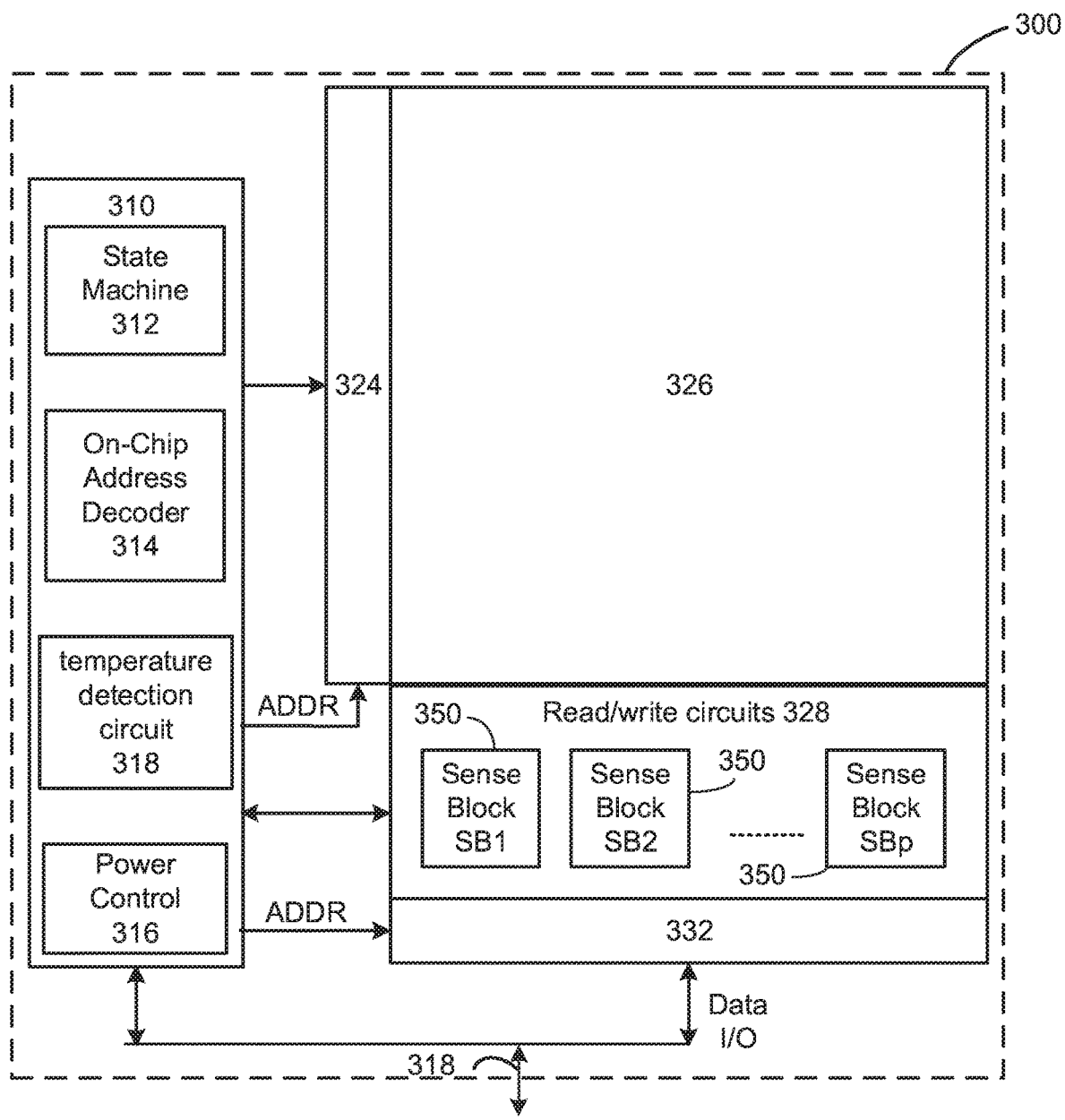
FIG. 2 is a block diagram of one embodiment of a memory die.

FIG. 2 is a functional block diagram of one embodiment of a memory die 300. Each of the one or more memory die 130 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement memory die interface 318.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus[0:7] | Input/Output | Data Input/Output (I/O) signal bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate the non-volatile memory.

In one embodiment, memory structure 326 comprises a monolithic three dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
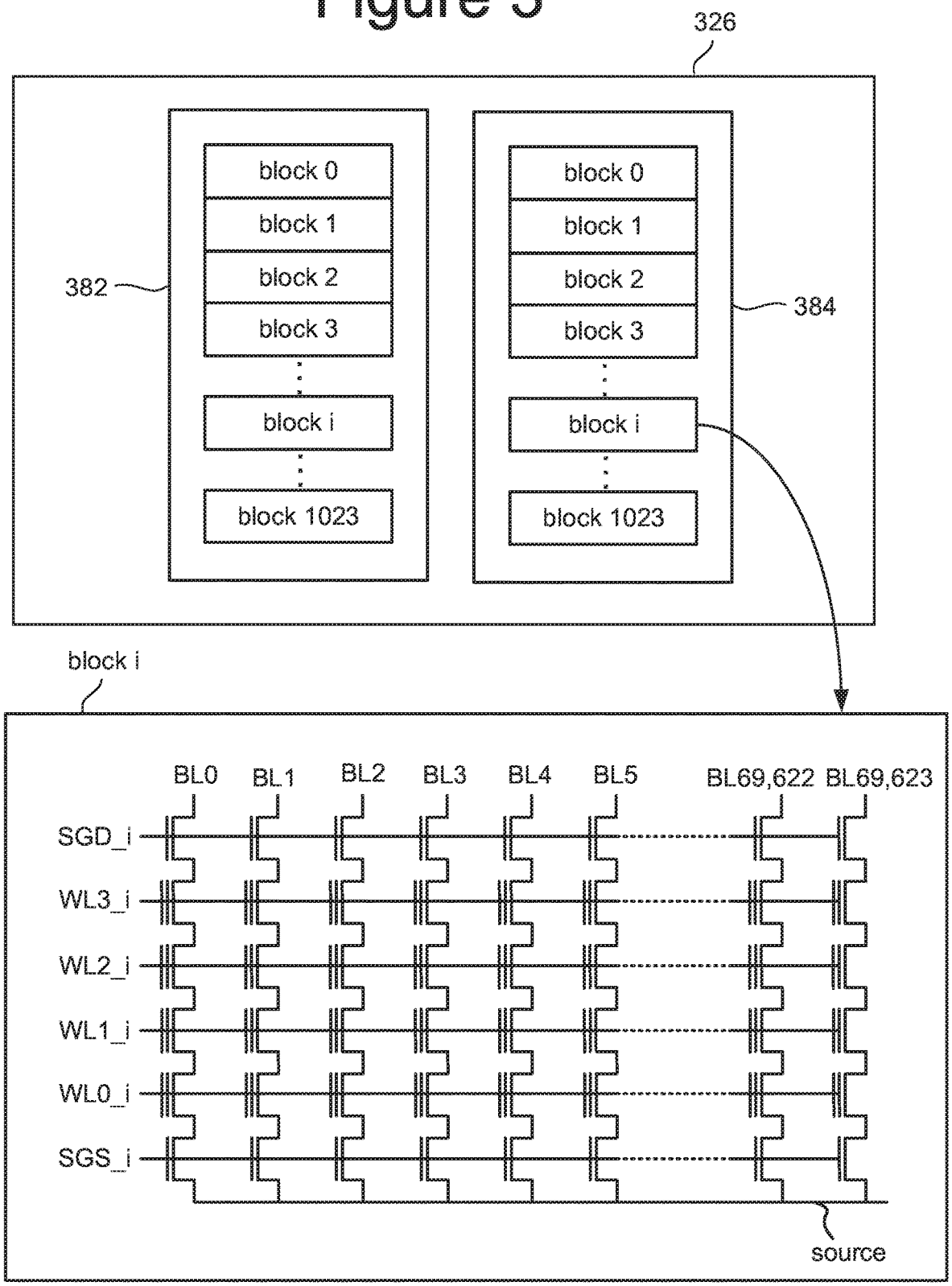
FIG. 3 is a block diagram that depicts details of a non-volatile memory structure.

FIG. 3 depicts an example of memory structure 326. In one embodiment, memory structure 326 is an array of memory cells divided into multiple planes. In the 284 of FIG. 3, memory structure 326 is divided into two planes: plane 382 and plane 384. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 326. As used herein, a memory erase block is a contiguous set of memory cells that share word lines and bit lines; for example, erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 3 shows 69,624 bit lines, a different number of bit lines can also be used.

Each memory erase block and/or each memory storage unit is typically divided into a number of pages. In one embodiment, a page is a unit of programming and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. FIG. 4A illustrates example threshold voltage distributions (ranges) for MLC memory cells that store three bits of data. Other embodiments, however, may use other data capacities per memory cell (e.g., such as one, two, four, or five bits of data per memory cell). FIG. 4A shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4A also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 4 also shows seven verify reference voltages (also referred to as program verify targets) Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4A represent the full sequence programming. The technology described herein can also be used with other types of programming in addition to full sequence programming (including, but not limited to, multiple stage/phase programming). In some embodiments, data states S1-S7 can overlap, with controller 102 relying on ECC to identify the correct data being stored.

FIG. 4B illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P. FIG. 4B also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs.

Example voltages for FIG. 4A are Vr1=0 v, V22=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v. Example voltages for FIG. 4B are Vse=Vr2=1 v, Vvs=Vv3=2.4 v and Vrs=1.2 v. Thus, the threshold voltage distribution S0 for the erased data state for MLC (in this example embodiment) is completely below 0 volts (see FIG. 4A). On the other hand, the threshold voltage distribution E for the erased data state for SLC depicted in FIG. 4B (in this example embodiment) is partly below 0 volts and partly above zero volts. The lower boundary (corresponding to Vvs) of the threshold voltage distribution P of the SLC programmed data state is the same voltage as Vv3.

When controller 102 receives data to be programmed into non-volatile memory 104, controller chooses a block of memory cells to program. Before a new block can be programmed, it must first be erased. Thus, blocks of memory cells (e.g., erase blocks) experience program/erase cycles (P/E cycles) that include erasing the block and programming the block. Some systems count program/erase cycles as first erasing and then programming, while other systems count program/erase cycles as first programming and then erasing. Either way, it is a program/erase cycle. In some embodiments, the age and wear of a block (or other unit) of non-volatile memory is judged by the number of program/erase cycles it has experienced. In one example, a memory is designed to perform 100,000 program/erase cycles, with blocks that have performed less than 30,000 program/erase cycles being considered as newer (or fresh) and blocks that have performed more than 30,000 program/erase cycles being considered as older.

Figure 6:
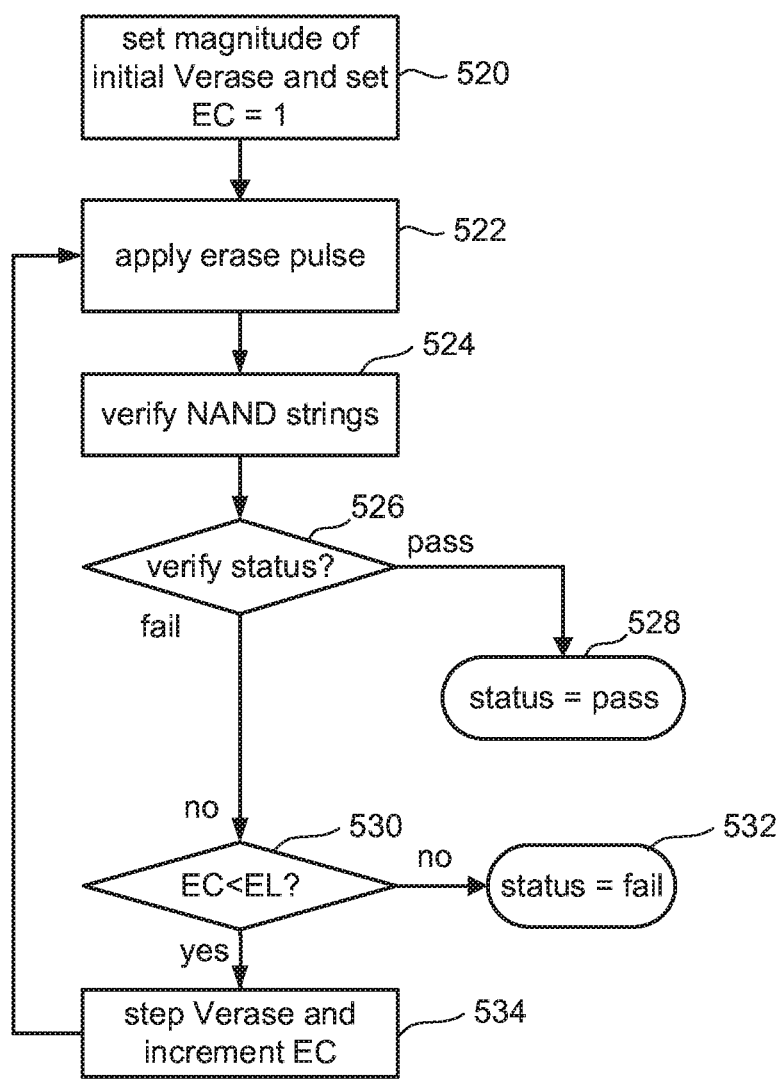
FIG. 6 is a flow chart describing one embodiment of a process for erasing.

As mentioned, a program/erase cycle includes programming data and erasing data. FIG. 5 is a flowchart describing one embodiment of a process for programming. FIG. 6 is a flowchart describing one embodiment of a process for erasing. Thus, a program/erase cycle includes performing the process of FIG. 5 and the process of FIG. 6 (in either order).

The process of FIG. 5 is performed by the memory die in response to instructions, data and one or more addresses from controller 102. The process of FIG. 5 can also be used to implement the full sequence programming discussed above. The process of FIG. 5 can also be used to implement each phase of a multi-phase programming process. Additionally, the process of FIG. 5 can be used to program memory cells connected to the same word line for SLC or MLC.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 470 of FIG. 5, the programming voltage (Vpgm) is initialized to the starting magnitude (e.g., ~12-16V or another suitable level) and a program counter PC maintained by the state machine is initialized at 1. In step 472, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art.

If a memory cell should be programmed, then the corresponding bit line is grounded. On the other hand, if the memory cell should remain at its current threshold voltage, then the corresponding bit line is connected to Vdd to inhibit programming. In step 472, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 474, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 476, it is determined whether all the memory cells have reached their target threshold voltages (pass). If so, the programming process is complete and successful because all selected memory cells were programmed and verified to their target data states. A status of "PASS" is reported in step 478. If, in 476, it is determined that not all of the memory cells have reached their target threshold voltages (fail), then the programming process continues to step 480.

In step 480, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 482, it is determined whether the count from step 480 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 478. In this situation, enough memory cells programmed correctly such that the few remaining memory cells that have not been completely programmed can be corrected using ECC during the read process. In some embodiments, step 480 will count the number of failed cells for each sector, each target data state or other unit, and those counts will individually or collectively be compared to a threshold in step 482.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 484 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 488. This is one example of a program fault. If the program counter PC is less than the program limit value PL, then the process continues at step 486 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 486, the process loops back to step 472 and another program pulse is applied to the selected word line so that another iteration (steps 472-486) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g. see verify reference voltages Vv1, Vv2, Vv3, Vv4, Vv5, Vv6, and Vv7 of FIG. 4) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 102 receives a request from the host (or a client, user, etc.) to program host data (data received from the host) into the memory system. In some embodiments, controller 102 arranges the host data to be programmed into units of data. For example, controller 102 can arrange the host data into pages, partial pages (a subset of a page), word line units, blocks, jumbo blocks, or other units.

Step 472 of FIG. 5 includes applying a program voltage pulse on the selected word line. Step 474 of FIG. 5 includes verification, which in some embodiments comprises applying the verify reference voltages on the selected word line. As steps 472 and 474 are part of an iterative loop, the program voltage is applied as a series of voltage pulses that step up in magnitude. Between voltage pulses, verify reference voltages are applied. The system tests the memory cells to determine whether threshold voltages of the memory cells are greater than the respective verify reference voltages by applying the verify references voltages as verify pulses.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory than others. Generally, ECC codes for flash storage devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the storage device), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engines 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied (e.g., by ECC engines 226/256) to multiple pages encoded across a number of storage elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used (e.g., by ECC engines 226/256) when reading data which implements error correction decoding corresponding to the encoding implemented in the controller 102. Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by:

$$Q = \log_2 \frac{P(v=0|Y)}{P(v=1|Y)}$$

where $P(v=0|Y)$ is the probability that a bit is a 0 given the condition that the state read is Y, and $P(v=1|Y)$ is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

When reading data, controller 102 (e.g., by ECC engines 226/256) receives the code word Y1 and accesses the LLRs and iterates in successive iterations in which it determines if parity checks of the error encoding process have been satisfied. If all parity checks have been satisfied, the decoding process has converged and the code word has been successfully error corrected (decoded). If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i. As part of the decoding process, controller tracks how many bits needed to be flipped, which is an indication of the number of errors in the information sensed from the memory cells. This indication of error is also referred to as bit error rate (BER).

FIG. 6 is a flow chart that describes the process of erasing. The process of FIG. 6 is performed by the memory die 300 in response instructions from controller 102 to erase a particular block or set of bocks. In one embodiment, erasing memory cells involves boosting the channel voltage of the NAND strings while holding the control gates of the memory cells at a low voltage (e.g., 0 volts). Various approaches can be used to boost the channel voltage. One approach includes generating holes at the source side and/or drain side select gate transistors of a 3D NAND string memory array using gate induced drain leakage (GIDL). This can be accomplished by applying a set of voltage pulses that increase in magnitude to the source line and/or bit lines.

Typically, the erase voltage is as a series of voltages pulses. In many implementations, the magnitude of the program pulses is increased with each successive pulse by a predetermined step size. In step 520 of FIG. 6, the erase voltage (Verase) is initialized to the starting magnitude and an erase counter EC maintained by the state machine is initialized at 1. In step 522, the system applies an erase voltage pulse via a source line (or the bit lines) to a block of memory cells. In step 524, the NAND strings are verified. In one embodiment, erase verify can be performed by testing whether the threshold voltage of each memory cell is above or below the voltage compare level (e.g., Vme of FIG. 4A or Vse of FIG. 4B). Because (in one embodiment) an entire NAND string is being erased (or entire block is being erased), all the memory cells on a NAND string are tested. If the NAND string conducts current, then all the memory cells on the NAND string have passed erase verify. If the NAND string does not conduct, then one or more of the memory cells have not passed erase verify. In step 526, it is determined whether the block has been verified to be successfully erased. If so, the erase process is complete and a status of "pass" is returned in step 528. Otherwise, it is determined whether the erase counter EC is greater than an erase limit EL. That is, the system determines whether there have been too many tries. If so, then the erase process has failed, a status of "fail" is returned in step 532 and the block is retired form further use. If the erase counter EC is not greater than an erase limit EL, then in step 534 the erase voltage Verase is stepped up to the next magnitude and the erase counter EC is incremented. After step 534, the process loops back to step 522 and another erase voltage pulse is applied to the selected block.

Many SSDs (or other storage systems) include non-volatile memory 104 having MLC memory cells and SLC memory cells. In some systems, the MLC memory cells and SLC memory cells have the same physical structure; however, controller 102 provisions a first subset of memory cells as SLC memory cells to store SLC data and a second subset of memory cells as MLC memory cells to store MLC data. High performance SSDs typically use SLC memory cells to achieve higher performance (e.g., faster). To further increase performance, it is proposed that for a subset of memory cells being operated as SLC memory cells the memory system performs a deeper erase process and a weaker (or shallower) program process. The deeper erase process enables the system to successfully read memory cells that experienced a weaker (or shallower) program process. The weaker (or shallower) program process results in a programmed threshold voltage distribution that is lower than the nominal programmed threshold voltage distribution. Having a lower programmed threshold voltage distribution reduces the magnitude of the programming and sensing voltages needed and, therefore, shortens the time required to generate the programming and sensing voltages, and reduces power consumption. Thus, a fast SLC configuration is proposed herein.

As the memory cells age (e.g., experience large amounts of program/erase cycles), performance can degrade, which may result in more errors during programming and reading. While ECC can correct errors, if there are many errors then the ECC process take a long time. Therefore, the above-described proposal to perform a deeper erase process and a weaker (shallower) program process may not be as effective for memory cells that have undergone many program/erase cycles. To address this issue, the storage device will monitor the number of program/erase cycles (and/or other operating conditions of the memory cells) and adjust the depth of erase and programming accordingly.

FIG. 7 is a flow chart describing one embodiment for operating non-volatile memory that performs a deeper erase process and a weaker program process for a subset of SLC memory cells in order to achieve higher performance, such as faster programming and reading. The process of FIG. 7 can be performed by any of the embodiments of a control circuit described above. In one example implementation, the process of FIG. 7 is performed by controller 102 managing non-volatile memory 104. In step 602 of FIG. 7, controller 102 monitors an operating condition for a plurality of memory cells. Examples of operating conditions include program erase/cycles, bit error rate, bad block numbers, etc. The plurality of memory cells can be a block, multiple blocks or a different aggregate/unit of memory cells. In one embodiment, the plurality of memory cells are SLC memory cells configured to store data as SLC data. In step 604, controller 102 erases the plurality of memory cells by setting threshold voltages of the plurality of memory cells to a range of threshold voltages for erase. For example, controller 102 can instruct a memory die 300 (or multiple memory die) to erase the memory cells such that the threshold voltage of the memory cells are within S0 (see FIG. 4A) or E (see FIG. 4B). In response to such instructions, the one or more memory dies can perform the process of FIG. 6. In step 606, controller 102, programs the plurality of memory cells as SLC memory cells by setting threshold voltages of the plurality of memory cells to a range of threshold voltages for programming. For example, controller 102 can instruct a memory die 300 (or multiple memory die) to program the memory cells such that the threshold voltage of the memory cells are within threshold voltage distribution (range) P (see FIG. 4B). In response to such instructions, the one or more memory dies can perform the process of FIG. 5 to set threshold voltages of the memory cells to threshold voltage distribution (range) P (see FIG. 4B). In step 608, controller 102 changes the range of threshold voltages for programming and the range of threshold voltages for erase in response to the operating condition satisfying a test. As mentioned above, one example of an operating condition is program/erase cycles and one example of a test is whether the number of program/erase cycles for the block (or other unit of memory cells) is greater than a threshold (e.g., 30,000 cycles).

Figure 8A:
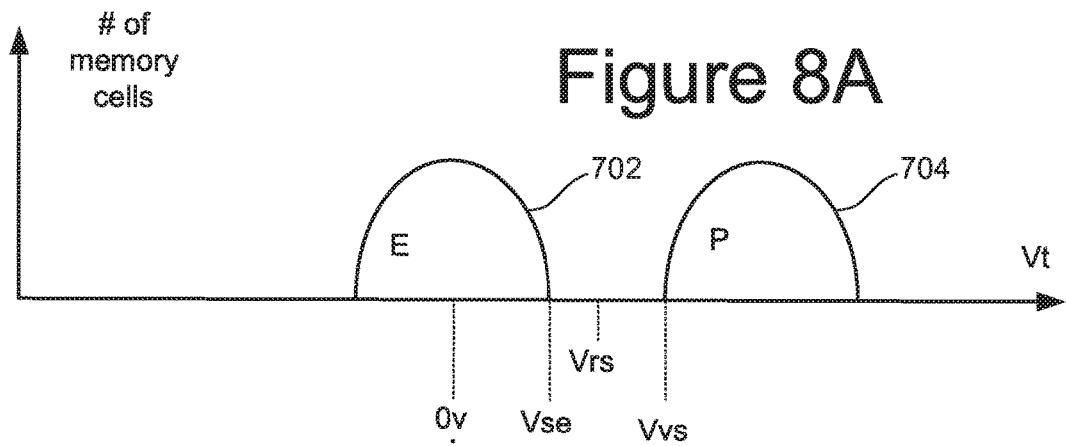
FIG. 8A is a graph of number of memory cells versus threshold voltage.
Figure 8B:
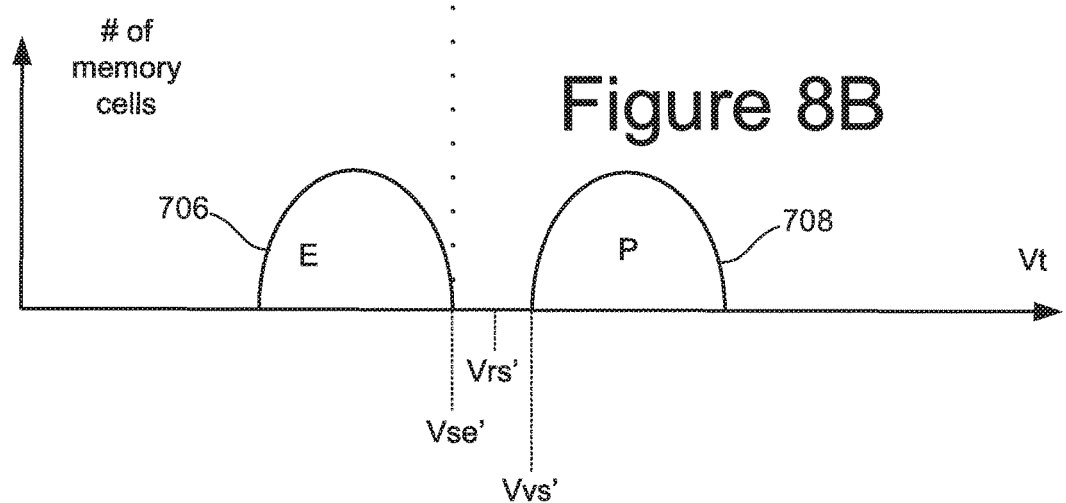
FIG. 8B is a graph of number of memory cells versus threshold voltage.

In one embodiment, the changing the range of threshold voltages for programming and the range of threshold voltages for erase comprises lower the range of threshold voltages for programming and lowering the range of threshold voltages for erase such that the memory cells experience a deeper erase and weaker (shallower) program. This is graphically illustrated by FIGS. 8A and 8B. FIG. 8A shows nominal threshold voltage distribution (range) 702 for erased SLC memory cells and nominal threshold voltage distribution (range) 704 for programmed SLC memory cells, and is identical to FIG. 4B. FIG. 8B shows deeper/lower threshold voltage distribution (range) 706 for erased SLC memory cells that implement the fast SLC configuration proposed herein and shallower/weaker threshold voltage distribution (range) 708 for programmed SLC memory cells that implement the fast SLC configuration proposed herein. Threshold voltage distribution 708 is lower (in voltage magnitude) than threshold voltage distribution 704. Threshold voltage distribution 706 is lower (in voltage magnitude) than threshold voltage distribution 702. FIG. 8B also shows a read reference voltage (also referred to as read compare voltage) Vrs', a verify reference voltage (also referred to as program verify target) Vvs' and an erase verify target Vse'. When programming from E to P for programmed SLC memory cells that implement the fast SLC configuration proposed herein, the system raises the threshold voltages of the memory cells until they reach at least Vvs'. When erasing from P to E for programmed SLC memory cells that implement the fast SLC configuration proposed herein, the system lowers the threshold voltages of the memory cells until they reach at least Vse'. To read a memory cell storing SLC data that implement the fast SLC configuration proposed herein, the systems test whether the threshold voltage of the memory cells is less than or greater than Vrs'. Example voltages for FIG. 8B are Vse'=0 v, Vvs'=1 v and Vrs'=0.5 v.

Figure 9:
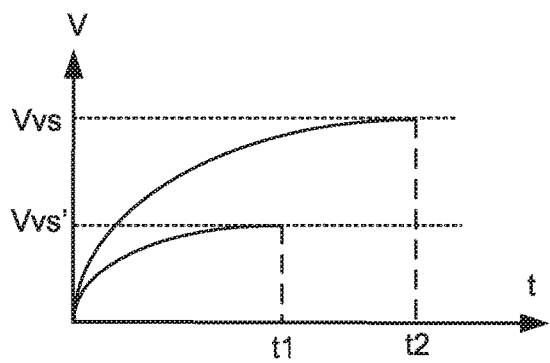
FIG. 9 is a graph of voltage versus time.

As Vvs' is lower than Vvs, the voltage Vvs' can be generated and applied to the word lines faster than Vvs, which increases the speed of the programming process. This is graphically depicted in FIG. 9, which shows rise time for a word line receiving Vvs and rise time for a word line receiving Vvs'. A word line reaches Vvs' at time t1. A word line reaches Vvs at time t2, which is later than t1. Therefore, using the fast SLC configuration proposed herein saves t2−t1 for each iteration of the programming process of FIG. 5. Additionally, as Vrs' is lower than Vrs, the voltage Vrs' can be generated and applied to the word lines faster than Vvs, which increased the speed of the reading process. Additionally, the time needed to generate the program voltage Vpgm for threshold voltage distribution 708 is faster than the time needed to generate the program voltage Vpgm for threshold voltage distribution 704.

Figure 10:
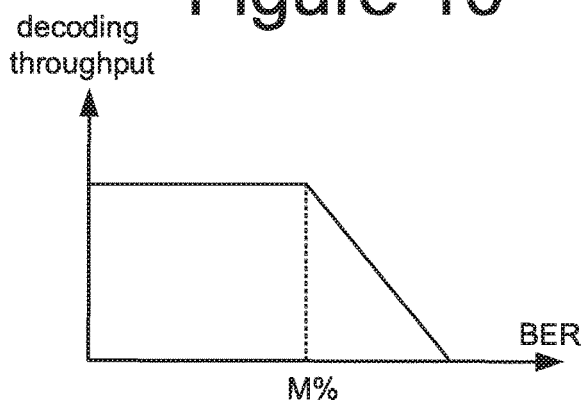
FIG. 10 is a graph of ECC decoding throughput versus bit error rate (BER).

FIGS. 8A and 8B also show that the distance between threshold voltage distribution 706 and threshold voltage distribution 708 is smaller than the distance between threshold voltage distribution 702 and threshold voltage distribution 704. This reduction in margin between erase and program data states, and the deeper erase in combination with shallower programming, could possibly lead to a higher bit error rate. Having a higher bit error rate is not necessarily a problem as the ECC decoding system can fix the errors in the data. FIG. 10 shows that the memory system can afford a higher bit error rate without reducing performance. Specifically, FIG. 10 show ECC decoding throughput versus bit error rate. The graph indicates that the performance is flat until the bit error rate reaches some number M %, which is different for different designs. Therefore, the memory system should be configured such that the bit error rate is small enough to keep performance from degrading. Experimentation has shown that adjusting the threshold voltage distributions from FIG. 8A to FIG. 8B does not cause the bit error rate to increase beyond the point (e.g., M %) that causes the ECC decoding throughput to slow down.

Figure 11:
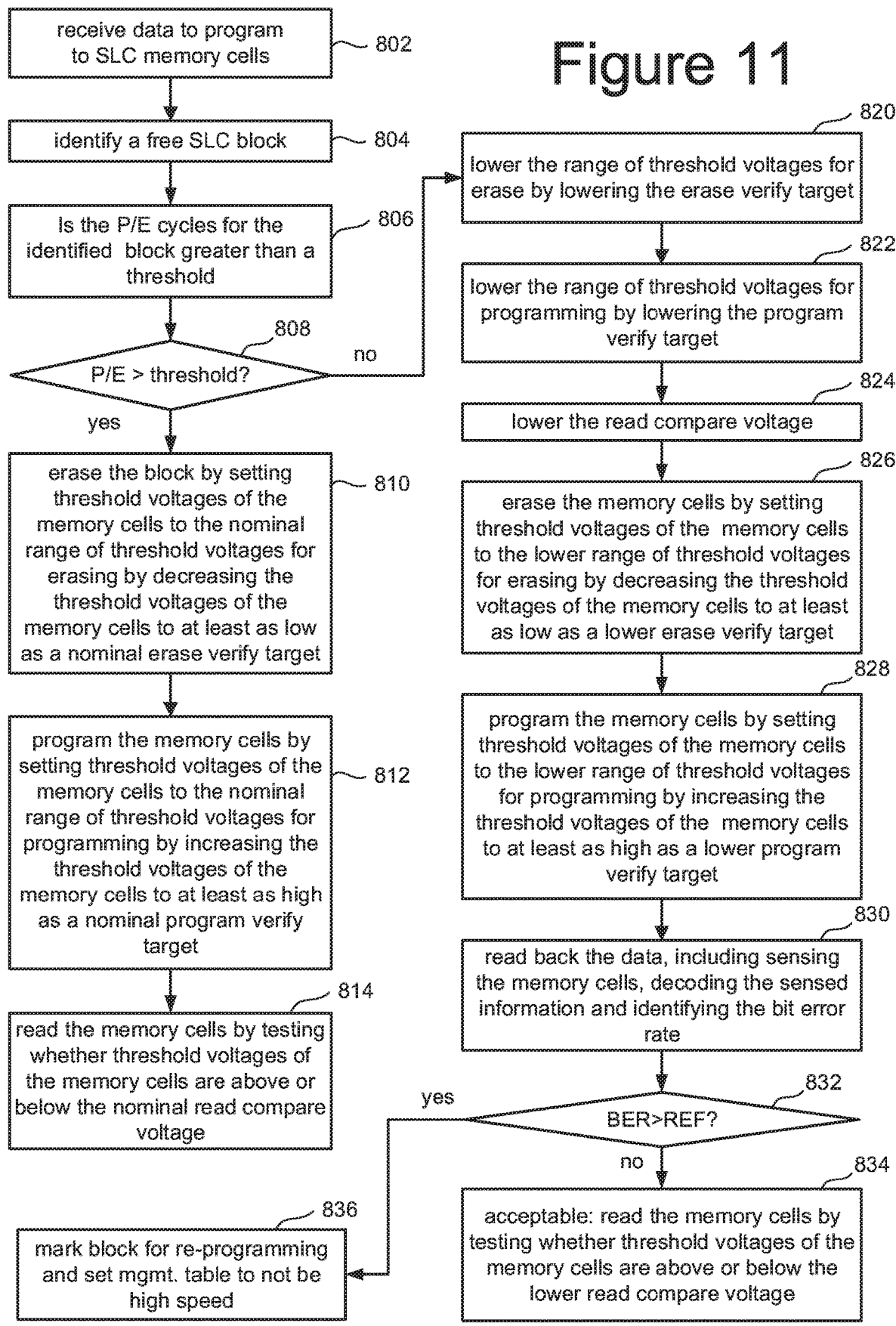
FIG. 11 is a flow chart describing one embodiment of a process for operating non-volatile memory.

FIG. 11 is a flow chart describing one embodiment for operating non-volatile memory that performs a deeper erase process and a weaker program process for a subset of SLC memory cells in order to achieve higher performance, such as faster programming and reading. FIG. 11 provides a more detailed example implementation of the process of FIG. 7. The process of FIG. 11 can be performed by any of the embodiments of a control circuit described above. In one example implementation, the process of FIG. 11 is performed by controller 102 managing non-volatile memory 104.

In step 802 of FIG. 11, controller 102 receives data to be programmed into non-volatile memory 104 as SLC data. In step 804, controller 102 identifies a free block of SLC memory cells for storing the data. In step 806, controller 102 tests whether the number of program/erase cycles of the block identified in step 804 is greater than a threshold. On example of a threshold is 30,000 cycles. If the number of program/erase cycles of the block identified in step 804 is greater than the threshold (step 808), then controller 102 does not implement the fast SLC configuration and in step 810 controller 102 erases the block of memory cells by setting threshold voltages of the memory cells to the nominal range of threshold voltages for erasing (e.g. threshold distribution 702) by decreasing the threshold voltages of the memory cells to at least as low as a nominal erase verify target (e.g., Vse). In step 812, controller 102 programs the memory cells by setting threshold voltages of the memory cells to the nominal range of threshold voltages for programming (e.g. threshold distribution 704) by increasing the threshold voltages of the memory cells to at least as high as a nominal program verify target (e.g., Vvs). In step 814 (which can be performed much later in time), controller 102 reads the memory cells by testing whether threshold voltages of the memory cells are above or below the nominal read compare voltage (e.g., Vrs).

If the number of program/erase cycles of the block identified in step 804 is not greater than the threshold (step 808), then controller 102 does implement the fast SLC configuration and in step 820 controller 102 lowers the range of threshold voltages for erase by lowering the erase verify target (e.g., from Vse to Vse'). In step 822, controller 102 lowers the range of threshold voltages for programming by lowering the program verify target (e.g., from Vvs to Vvs'). In step 824, controller 102 lowers the read compare voltage (e.g., from Vrs to Vrs'). In step 826, controller erases the memory cells by setting threshold voltages of the memory cells to the lower range of threshold voltages for erasing (e.g., threshold distribution 706) by decreasing the threshold voltages of the memory cells to at least as low as the lower erase verify target (e.g., Vse'). In step 828, controller 102 programs the memory cells by setting threshold voltages of the memory cells to the lower range of threshold voltages for programming (e.g., threshold distribution 708) by increasing the threshold voltages of the memory cells to at least as high as a lower program verify target (e.g., Vvs'). In step 830, controller 102 reads back the data, including sensing the memory cells, decoding the sensed information and identifying the bit error rate. If the bit error rate (BER) is not greater than a references error rate (REF), then implementing the fast SLC configuration is acceptable. Later in time, in response to a request from the host to read or for another reason), controller 102 reads the memory cells by testing whether threshold voltages of the memory cells are above or below the lower read compare voltage (e.g., Vvs').

If the bit error rate (BER) is greater than the references error rate (REF), then implementing the fast SLC configuration is not acceptable (step 836). Therefore, the management tables maintained by the controller 102 are updated to indicate that the block should not be used to implement the fast SLC configuration. Additionally, the block is marked to have the data stored in that block reprogrammed to another block (this process can happen in the background when the memory system is idle).

Figure 12:
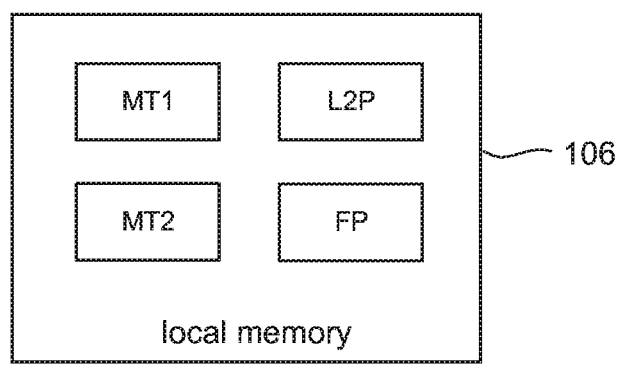
FIG. 12 is a block diagram that depicts details of a local volatile memory connected to the controller.

FIG. 12 is a block diagram describing more details of a subset of data that can be stored in one embodiment of local memory 106 (which is connected to controller 102). FIG. 12 shows local memory 106 comprising logical to physical tables (L2P), a first set of management tables MT1, a second set of management tables MT2, and first pages FP. Logical to physical tables (L2P) are used to store the translations between physical addresses in non-volatile memory 104 and the logical addresses used by host 120. The first set of management tables MT1 stores block level management information for blocks of memory cells storing MLC data and blocks of memory cells storing SLC data not implementing the fast SLC configuration. The second set of management tables MT2 stores block level management information for blocks of memory cells storing SLC data that implement the fast SLC configuration. The block level management information includes an indication of whether the block is storing MLC data or SLC data, whether the block is implementing the fast SLC configuration, whether the block has valid data or invalid data, whether should not be used to implement the fast SLC configuration (see step 836), whether data stored in that block should be reprogrammed to another block (see step 836). Using separate management tables MT2 for memory cells storing SLC data that implement the fast SLC configuration allow for faster access to the management tables MT2. First pages FP is a portion of local memory 106 that stores the first page of data for each bock (e.g., erase block) that implements the fast SLC configuration (e.g., performs the process of FIG. 7).

Figure 13:
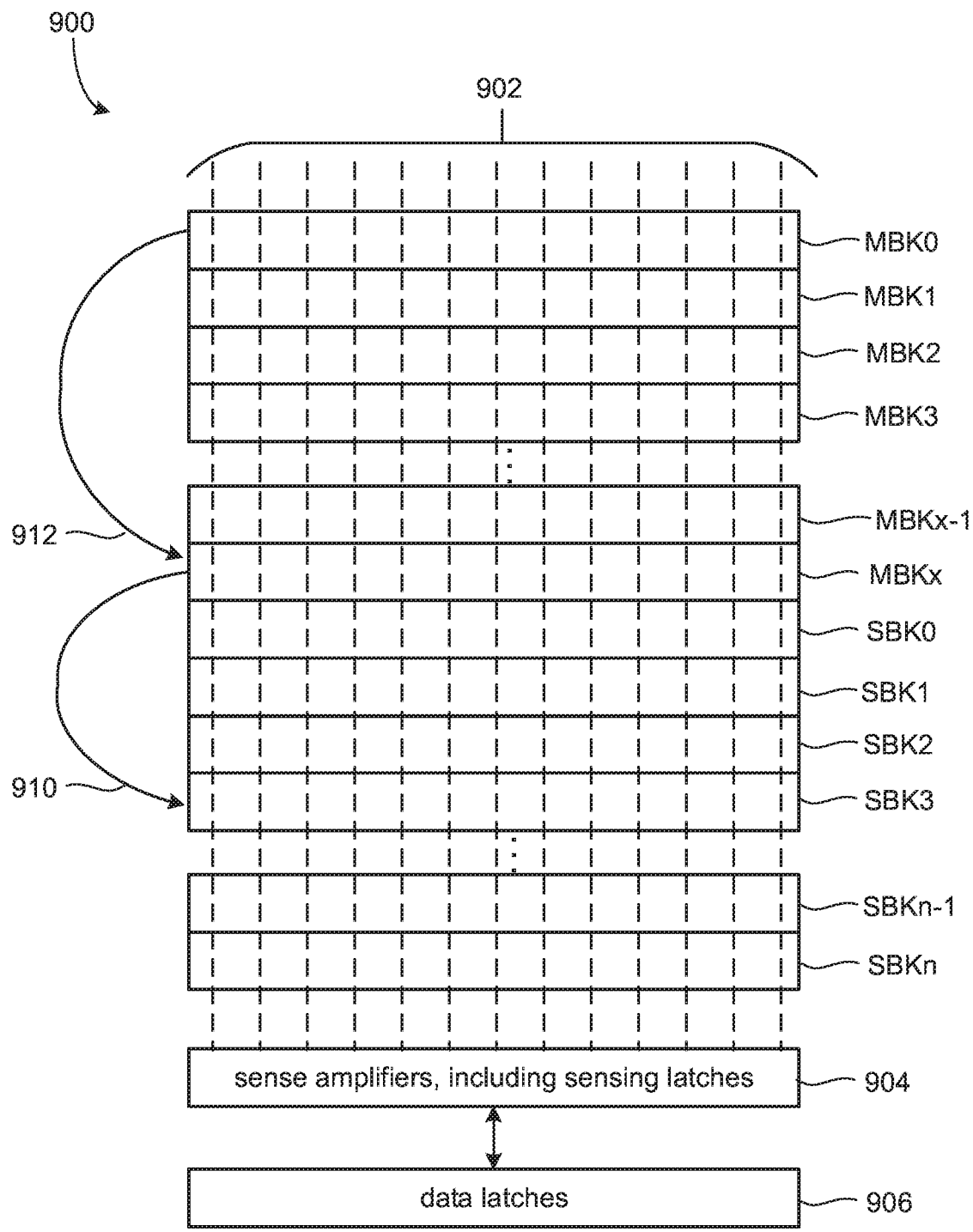
FIG. 13 depicts a plurality of blocks of non-volatile memory.

In one embodiment, all memory cells of the memory system store SLC data. Another embodiment of the proposed memory system includes a first plurality of memory cells storing SLC data and a second plurality of memory cells storing MLC data. In one example, 90% of the memory cells store MLC data and 10% of the memory cells store SLC data (although other percentages can also be used). The first plurality of memory cells (SLC) are divided into a first set of erase blocks that are connected to a set of bit lines. The second plurality of memory cells (MLC) are also divided into a second set of erase blocks that are connected to the same bit lines. In one implementation, controller 102 allocates the blocks to be MLC and SLC such that the first set of erase blocks are physically closer to the sense circuits (e.g., sense blocks 350) than the first set of erase blocks. This is depicted in FIG. 13, which shows a plane of memory cells 900. Plane 900 can correspond to plane 382 or 284 of FIG. 3. Plane 900 is divided into blocks. The first set of blocks (SLC memory cells) includes blocks SBK0, SBK1, SBK2, SBK3, . . . , SBKn−1, SBKn. The second set of blocks (MLC memory cells) includes blocks MBK0, MBK1, MBK3, . . . , MBKx−1, MBKx. A set of bit lines 902 run across plane 900. The first set of blocks (SLC memory cells) and the second set of blocks (MLC memory cells) are all connected to bit lines 902.

Connected to plane 900 are sense amplifiers (including sense latches) 904 that comprise all or a portion of one or more sense blocks 350. Connected to sense amplifiers (including sense latches) 904 are data latches 906, which connect to decoders 332 (see FIG. 2). As can be seen, the first set of blocks (SLC memory cells) are closer to sense amplifiers (including sense latches) 904 than the second set of blocks (MLC memory cells). Being closer to sense amplifiers (including sense latches) 904 results in the first set of blocks (SLC memory cells) having shorter bit line RC delay than the second set of blocks (MLC memory cells), which can further speed up performance of the first set of blocks (MLC memory cells).

If there is a bad SLC block (ie a bad block in the first set of blocks), then controller 102 will convert the MLC block closest to the sense amplifiers (including sense latches) 904 into a SLC block (see arrow 910 representing that block MBKx is replacing bad block SBK3), and the furthest MLC block will substitute in as an MLC block for the MLC block converted to SLC (see arrow 912 representing that MLC block MBK0 is replacing MBKx).

Figure 14:
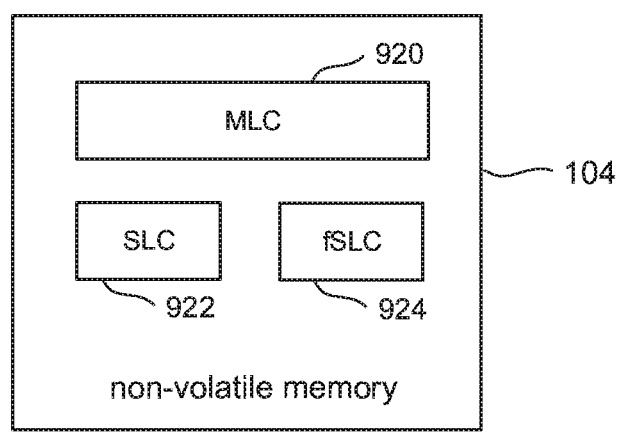
FIG. 14 is a block diagram that depicts details of a non-volatile memory connected to the controller.

FIG. 14 shows non-volatile memory 104 divided into region 920 that includes memory cells for storing MLC data, region 922 that includes memory cells for storing SLC data that do not implement the fast SLC configuration and region 924 that includes memory cells for storing SLC data that do implement the fast SLC configuration. The memory cells in region 924 have ranges of threshold voltages that change in response to the number of program/erase cycles (or other test of an operating condition), as described above with respect to FIGS. 7 and 11. The memory cells in region 922 have ranges of threshold voltages that do not change in response to the number of program/erase cycles (or other test of an operating condition). That is, controller 102 is configured to program the memory cells of region 922 as SLC memory cells by setting threshold voltages to a range of threshold voltages for programming that does not change in response to the operating condition satisfying the test and to erase the memory cells of region 922 by setting threshold voltages to a range of threshold voltages for erase that does not change in response to the operating condition satisfying the test. The memory cells in region 920 have a set of ranges of threshold voltages (see FIG. 4A) that do not change in response to the number of program/erase cycles (or other test of an operating condition). That is, controller 102 is configured to program the memory cells of region 920 as MLC memory cells by setting threshold voltages to a set of ranges of threshold voltages for programming that do not change in response to the operating condition satisfying a test and to erase the memory cells of region 920 by setting threshold voltages to a range of threshold voltages for erasing that does not change in response to the operating condition satisfying the test.

In one embodiment, controller 102 writes data to the MLC memory cells of region 920 so that the memory cells are in data states S0-S7 of FIG. 4A. For memory cells having a number of program/erase cycles less than the threshold (or another test of an operating condition), controller 102 writes data to the SLC memory cells of region 924 so that the memory cells are in an erased data state corresponding to data state S0 (see FIG. 4A) and a programmed data state corresponding to data state S1. For memory cells having a number of program/erase cycles greater than the threshold (or another test of an operating condition), controller 102 writes data to the SLC memory cells of region 924 so that the memory cells are in an erased data state corresponding to data state S1 (see FIG. 4A) and a programmed data state corresponding to data state S2. Note that threshold voltage distribution S2 of FIG. 4A is lower in voltage magnitude than threshold voltage distribution P of FIG. 4B. In the embodiment of FIG. 13, controller 102 writes data to the SLC memory cells of region 922 so that the memory cells are in an erased data state corresponding to data state S1 (see FIG. 4A) and a programmed data state corresponding to data state S2, or an erased data state corresponding to data state E (see FIG. 4B) and a programmed data state corresponding to data state P. One example of operation of the memory system according to the embodiment of FIG. 14 is described by the flow chart of FIG. 15.

FIG. 15 is a flow chart describing one embodiment for operating non-volatile memory that performs a deeper erase process and a weaker program process for a subset of SLC memory cells in order to achieve higher performance, such as faster programming and reading. FIG. 15 provides an example implementation of the process of FIG. 7 and an example implementation of the process of FIG. 11. The process of FIG. 15 can be performed by any of the embodiments of a control circuit described above. In one example implementation, the process of FIG. 15 is performed by controller 102 managing non-volatile memory 104.

In step 950 of FIG. 15, controller 102 receives a request to write data. The request can be received from host 120 or another entity. In some embodiment, the request to write data will include an indication of whether the data is to be stored as MLC data, long term SLC data or short term SLC data. In some embodiments, controller 102 determines whether the data is to be stored as MLC data, long term SLC data or short term SLC data based on what kind of data it is and/or where the data comes from. Based on the type of data (step 952), controller will perform different operations. If the data is to be stored as MLC data, then in step 954 controller 102 writes the data to a first set of memory cells (e.g., in the MLC region 920—see FIG. 14) as MLC data including causing threshold voltages of the first set of memory cells to be within a set of threshold voltage distributions (see FIG. 4A). If the data is to be stored as long term SLC data, then in step 956 controller 102 writes the data to a second set of memory cells (in region 922) as SLC data including causing threshold voltages of the second set of memory cells to be within two threshold voltage distributions that have same lower boundary voltages (e.g., Vv1 and Vv2) as a first pair of threshold voltage distributions of the set of threshold voltage distributions.

If the data is to be stored as short term SLC data, then the controller can implement the fast SLC configuration for memory cells in region 924. In step 960, controller 102 tests whether the number of program/erase cycles of a third set of memory cells (in region 924) is greater than a threshold. If the number of program/erase cycles is not greater than the threshold (step 960), then in step 962 controller 102 writes data to the third set of memory cells as SLC data (implementing the fast SLC configuration) including causing threshold voltages of the third set of memory cells to be within two threshold voltage distributions that have same lower boundary voltages (e.g., lower bound of S0 and Vv1) as a second pair of threshold voltage distributions of the set of threshold voltage distributions. The second pair of threshold voltage distributions are lower than the first pair of threshold voltage distributions. For example, second pair of threshold voltage distributions correspond to S0/S1 and the first pair of threshold voltage distributions correspond to S1/S2 (or S2/S3 or E/P).

In one embodiment, the controller can determine an error rate from writing data to the third set of non-volatile memory cells. In response to determining that the error rate is more than a threshold, the controller can write data to the third set of non-volatile memory cells as SLC data including causing threshold voltages of the third set of non-volatile memory cells to be within two threshold voltage distributions that have same lower boundary voltages as the first pair of threshold voltage distributions of the set of threshold voltage distributions.

If (in step 960) the number of program/erase cycles is greater than the threshold, then in step 964 controller 102 writes data to the third set of memory cells as SLC data (not implementing the fast SLC configuration) including causing threshold voltages of the third set of memory cells to be within two threshold voltage distributions that have same lower boundary voltages as the first pair of threshold voltage distributions of the set of threshold voltage distributions.

The above-discussion proposes to perform a deeper erase process and a weaker/shallower program process for a subset of SLC memory cells. The weaker/shallower program process results in a programmed threshold voltage distribution that is lower than the "nominal" programmed threshold voltage distribution. Having a lower programmed threshold voltage distribution reduces the magnitude of the programming and sensing voltages needed and, therefore, shortens the time required to generate the programming and sensing voltages, and reduces power consumption.

One embodiment includes a non-volatile storage apparatus comprising a first plurality of non-volatile memory cells and a control circuit connected to the first plurality of non-volatile memory cells. The control circuit is configured to monitor an operating condition for the first plurality of non-volatile memory cells. The control circuit is configured to program the first plurality of non-volatile memory cells as SLC memory cells by setting threshold voltages of the first plurality of non-volatile memory cells to a range of threshold voltages for programming. The control circuit is configured to erase the first plurality of non-volatile memory cells by setting threshold voltages of the first plurality of non-volatile memory cells to a range of threshold voltages for erase. The control circuit is configured to change the range of threshold voltages for programming and the range of threshold voltages for erase in response to the operating condition satisfying a test.

One embodiment includes a method of operating non-volatile storage. The method comprises a controller writing data to a first set of non-volatile memory cells as MLC data including causing threshold voltages of the first set of non-volatile memory cells to be within a set of threshold voltage distributions; the controller writing data to a second set of non-volatile memory cells as SLC data including causing threshold voltages of the second set of non-volatile memory cells to be within two threshold voltage distributions that have same lower boundary voltages as a first pair of threshold voltage distributions of the set of threshold voltage distributions; and the controller writing data to a third set of non-volatile memory cells as SLC data including causing threshold voltages of the third set of non-volatile memory cells to be within two threshold voltage distributions that have same lower boundary voltages as a second pair of threshold voltage distributions of the set of threshold voltage distributions. In one example, the writing data to the first set of non-volatile memory cells includes programming and erasing.

One embodiment includes a non-volatile storage apparatus comprising one or more memory dies comprising a plurality of non-volatile memory cells and a controller connected to the one or more non-volatile memory dies. The controller is configured to use a first subset of the memory cells as MLC memory cells, a second subset of the memory cells as SLC memory cells and a third subset of the memory cells as SLC memory cells. The controller is configured to erase the second subset of the memory cells by setting threshold voltages of the second subset of the memory cells to a first range of threshold voltages and to program the second subset of the memory cells by setting threshold voltages of the second subset of the memory cells to a second range of threshold voltages, if the second subset of the memory cells has performed less than a threshold number of program/erase cycles; erase the second subset of the memory cells by setting threshold voltages of the second subset of the memory cells to a third range of threshold voltages and to program the second subset of the memory cells by setting threshold voltages of the second subset of the memory cells to a fourth range of threshold voltages, if the second subset of the memory cells has performed more than the threshold number of program/erase cycles; and erase the third subset of the memory cells by setting threshold voltages of the third subset of the memory cells to a range of threshold voltages for erase and to program the third subset of the memory cells by setting threshold voltages of the third subset of the memory cells to a range of threshold voltages for programming, if the third subset of the memory cells have performed less than the threshold number of program/erase cycles and if the third subset of the memory cells has performed more than the threshold number of program/erase cycles. In some embodiments, the second range can be the same as the third range.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first data transfer message and second data transfer message are used as identification labels to distinguish the messages and are not meant to indicate an order.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a first plurality of non-volatile memory cells;
a control circuit connected to the first plurality of non-volatile memory cells, the control circuit is configured to monitor an operating condition for the first plurality of non-volatile memory cells, the control circuit is configured to program the first plurality of non-volatile memory cells as single level cell ("SLC") memory cells by setting threshold voltages of the first plurality of non-volatile memory cells to a first range of threshold voltages for programming and erase the first plurality of non-volatile memory cells by setting threshold voltages of the first plurality of non-volatile memory cells to a first range of threshold voltages for erase in response to the operating condition for the first plurality of non-volatile memory cell satisfying a test, the control circuit is configured to program the first plurality of non-volatile memory cells as SLC memory cells by setting threshold voltages of the first plurality of non-volatile memory cells to a second range of threshold voltages for programming and erase the first plurality of non-volatile memory cells by setting threshold voltages of the first plurality of non-volatile memory cells to a second range of threshold voltages for erase in response to the operating condition for the first plurality of non-volatile memory cell not satisfying the test, the second range of threshold voltages for programming is different than the first range of threshold voltages for programming, the second range of threshold voltages for erase is different than the first range of threshold voltages for erase; and
a second plurality of non-volatile memory cells connected to the control circuit, the control circuit is configured to program the second plurality of non-volatile memory cells as SLC memory cells by setting threshold voltages of the second plurality of non-volatile memory cells to a range of threshold voltages for programming that does not change in response to the operating condition for the second plurality of non-volatile memory cells satisfying the test, the control circuit is configured to erase the second plurality of non-volatile memory cells by setting threshold voltages of the second plurality of non-volatile memory cells to a range of threshold voltages for erase that does not change in response to the operating condition for the second plurality of non-volatile memory cells satisfying the test.

2. The non-volatile storage apparatus of claim 1, wherein:
the operating condition is number of program/erase cycles; and
the test is whether the memory cells have performed more than a threshold number of program/erase cycles.

3. The non-volatile storage apparatus of claim 1, wherein:
the control circuit is configured to read the first plurality of non-volatile memory cells by testing whether threshold voltages of the first plurality of non-volatile memory cells are above or below a read compare voltage; and
the control circuit is configured to raise the read compare voltage response to the operating condition not satisfying the test.

4. The non-volatile storage apparatus of claim 1, further comprising:
a third plurality of non-volatile memory cells connected to the control circuit, the control circuit is configured to program the third plurality of non-volatile memory cells as MLC memory cells by setting threshold voltages of the third plurality of non-volatile memory cells to a set of ranges of threshold voltages for programming that do not change in response to the operating condition for the third plurality of non-volatile memory cells satisfying the test, the control circuit is configured to erase the third plurality of non-volatile memory cells by setting threshold voltages of the third plurality of non-volatile memory cells to a range of threshold voltages for erasing that does not change in response to the operating condition for the third plurality of non-volatile memory cells satisfying the test.

5. The non-volatile storage apparatus of claim 1, wherein:
the control circuit is configured to determine an error rate when programming the first plurality of non-volatile memory cells;
the error rate is the operating condition; and
the test is whether the is less than a reference number.

6. The non-volatile storage apparatus of claim 1, further comprising:
a third plurality of non-volatile memory cells connected to the control circuit, the third plurality of non-volatile memory cells are divided into a first set of erase blocks connected to a first set of bit lines, the third plurality of non-volatile memory cells are configured to operate as MLC memory cells, the first plurality of non-volatile memory cells are divided into a second set of erase blocks connected to the first set of bit lines, the control circuit includes sense circuits, the second set of erase blocks are physically closer to the sense circuits than the first set of erase blocks.

7. The non-volatile storage apparatus of claim 1, further comprising:
additional non-volatile memory cells connected to the control circuit, the additional non-volatile memory cells are divided into a first set of erase blocks, the first plurality of non-volatile memory cells divided into a second set of erase blocks; and
local volatile memory connected to the control circuit, the local volatile memory is configured to store a page of data for each of the second set of erase blocks.

8. The non-volatile storage apparatus of claim 1, further comprising:
additional non-volatile memory cells connected to the control circuit; and
local volatile memory connected to the control circuit, the local memory includes a first portion configured to store management tables for the additional non-volatile memory cells and a second portion configured to store management tables for the first plurality of non-volatile memory cells.

9. The non-volatile storage apparatus of claim 1, wherein:
the control circuit is a controller;
the first plurality of non-volatile memory cells are NAND flash memory cells; and the controller and the first plurality of non-volatile memory cells form a solid state drive.

10. A non-volatile storage apparatus, comprising:
one or more memory dies comprising a plurality of non-volatile memory cells; and
a controller connected to the one or more non-volatile memory dies, the controller is configured to use a first subset of the memory cells as MLC memory cells, a second subset of the memory cells as SLC memory cells and a third subset of the memory cells as SLC memory cells;
the controller is configured to:
erase the second subset of the memory cells by setting threshold voltages of the second subset of the memory cells to a first range of threshold voltages and to program the second subset of the memory cells by setting threshold voltages of the second subset of the memory cells to a second range of threshold voltages, if the second subset of the memory cells has performed less than a threshold number of program/erase cycles;
erase the second subset of the memory cells by setting threshold voltages of the second subset of the memory cells to a third range of threshold voltages and to program the second subset of the memory cells by setting threshold voltages of the second subset of the memory cells to a fourth range of threshold voltages, if the second subset of the memory cells has performed more than the threshold number of program/erase cycles; and
erase the third subset of the memory cells by setting threshold voltages of the third subset of the memory cells to a range of threshold voltages for erase and to program the third subset of the memory cells by setting threshold voltages of the third subset of the memory cells to a range of threshold voltages for programming, if the third subset of the memory cells have performed less than the threshold number of program/erase cycles and if the third subset of the memory cells has performed more than the threshold number of program/ erase cycles;
the third range of threshold voltages is different than the first range of threshold voltages, and the fourth range of threshold voltages is different than the second range of threshold voltages.

11. The non-volatile storage apparatus of claim 10, wherein:
the first range of threshold voltages is lower in voltage than the third range of threshold voltages; and
the second range of threshold voltages is lower in voltage than the fourth range of threshold voltages.

12. The non-volatile storage apparatus of claim 10, wherein:
the controller is configured to determine an error rate for programming the second subset of memory cells; and
the controller is configured to erase the second subset of the memory cells by setting threshold voltages of the second subset of the memory cells to the third range of threshold voltages and to program the second subset of the memory cells by setting threshold voltages of the second subset of the memory cells to the fourth range of threshold voltages in response to the controller determining that the error rate for programming the second subset of memory cells is greater than a reference rate.

13. A non-volatile storage apparatus, comprising:
non-volatile memory cells; and
a control circuit connected to the non-volatile memory cells, the control circuit is configured to:
determine whether the non-volatile memory cells have performed more than a threshold number of program/ erase cycles,
if the non-volatile memory cells have performed less than a threshold number of program/erase cycles, erase the non-volatile memory cells using a first erase verify target voltage to decrease threshold voltages of the non-volatile memory cells to at least as low as the first erase verify target voltage,
if the non-volatile memory cells have performed more than the threshold number of program/erase cycles, erase the non-volatile memory cells using a second erase verify target voltage to decrease threshold voltages of the non-volatile memory cells to at least as low as the second erase verify target voltage such that the second erase verify target voltage is higher in voltage magnitude than the first erase verify target voltage,
if the non-volatile memory cells have performed less than the threshold number of program/erase cycles, read data from the non-volatile memory cells using a first read compare voltage, and
if the non-volatile memory cells have performed more than the threshold number of program/erase cycles, read data from the non-volatile memory cells using a second read compare voltage such that the second read compare voltage is higher in voltage magnitude than the first read compare voltage.

14. The non-volatile storage apparatus of claim 13, wherein the control circuit is further configured to:
if the non-volatile memory cells have performed less than the threshold number of program/erase cycles, program the non-volatile memory cells using a first program verify target voltage to increase threshold voltages of the non-volatile memory cells to at least as high as the first program verify target voltage,
if the non-volatile memory cells have performed more than the threshold number of program/erase cycles, program the non-volatile memory cells using a second program verify target voltage to increase threshold voltages of the non-volatile memory cells to at least as high as the second program verify target voltage such that the second program verify target voltage is higher in voltage magnitude than the first program verify target voltage.

15. The non-volatile storage apparatus of claim 14, wherein:
the control circuit is configured to program the non-volatile memory cells as single level cells ("SLC") memory cells.

16. The non-volatile storage apparatus of claim 14, wherein the control circuit is further configured to:
read back data programmed;
determine whether an amount of errors in the data read exceeds a reference number; and
cause the data to be reprogrammed if the amount of errors in the data read exceeds a reference number.

* * * * *